United States Patent
Parsa et al.

(10) Patent No.: US 9,568,565 B2
(45) Date of Patent: *Feb. 14, 2017

(54) VAPOR CELL STRUCTURE HAVING CAVITIES CONNECTED BY CHANNELS FOR MICRO-FABRICATED ATOMIC CLOCKS, MAGNETOMETERS, AND OTHER DEVICES

(71) Applicant: TEXAS INSTRUMENTS INCORPORATED, Dallas, TX (US)

(72) Inventors: Roozbeh Parsa, San Jose, CA (US); Peter J. Hopper, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 233 days.

This patent is subject to a terminal disclaimer.

(21) Appl. No.: 13/948,888

(22) Filed: Jul. 23, 2013

(65) Prior Publication Data

US 2015/0028866 A1   Jan. 29, 2015

(51) Int. Cl.
| | | |
|---|---|---|
| *H01S 1/06* | (2006.01) | |
| *G01R 33/032* | (2006.01) | |
| *G04F 5/14* | (2006.01) | |

(52) U.S. Cl.
CPC ............. *G01R 33/032* (2013.01); *G04F 5/14* (2013.01); *H01S 1/06* (2013.01); *Y10T 137/8593* (2015.04)

(58) Field of Classification Search
CPC ......... H03B 17/00; H05K 13/00; G01R 33/02; G04F 5/14; Y02P 70/521; Y02P 20/129; Y02P 20/134; Y02P 20/136; Y02E 10/50; Y02E 10/547; Y02E 10/548; Y02E 10/545; Y02E 10/52; Y02E 10/60; Y02E 10/41; Y02E 10/44; Y02E 10/542; Y02E 50/18

See application file for complete search history.

(56) References Cited

U.S. PATENT DOCUMENTS

| | | | |
|---|---|---|---|
| 5,657,340 | A | 8/1997 | Camparo et al. |
| 6,472,869 | B1 * | 10/2002 | Upschulte et al. ............ 324/304 |
| 2005/0007118 | A1 * | 1/2005 | Kitching et al. ............... 324/464 |
| 2008/0218281 | A1 * | 9/2008 | Lipp et al. ..................... 331/94.1 |
| 2012/0301631 | A1 | 11/2012 | Overstolz et al. |
| 2013/0015850 | A1 | 1/2013 | Lindorfer et al. |
| 2013/0015920 | A1 * | 1/2013 | Sato et al. .................... 331/94.1 |

FOREIGN PATENT DOCUMENTS

| | | |
|---|---|---|
| WO | WO 91/17452 A1 | 11/1991 |
| WO | WO 2009/084731 A1 | 7/2009 |
| WO | WO 2012/142654 A1 | 10/2012 |

* cited by examiner

*Primary Examiner* — Alesa Allgood
(74) *Attorney, Agent, or Firm* — Jacqueline J. Garner; Charles A. Brill; Frank D. Cimino

(57) ABSTRACT

A first apparatus includes a vapor cell having first and second cavities fluidly connected by multiple channels. The first cavity is configured to receive a material able to dissociate into one or more gases that are contained within the vapor cell. The second cavity is configured to receive the one or more gases. The vapor cell is configured to allow radiation to pass through the second cavity. A second apparatus includes a vapor cell having a first wafer with first and second cavities and a second wafer with one or more channels fluidly connecting the cavities. The first cavity is configured to receive a material able to dissociate into one or more gases that are contained within the vapor cell. The second cavity is configured to receive the one or more gases. The vapor cell is configured to allow radiation to pass through the second cavity.

11 Claims, 6 Drawing Sheets

VAPOR CELL STRUCTURE HAVING CAVITIES CONNECTED BY CHANNELS FOR MICRO-FABRICATED ATOMIC CLOCKS, MAGNETOMETERS, AND OTHER DEVICES

TECHNICAL FIELD

This disclosure is generally directed to gas cells. More specifically, this disclosure is directed to a vapor cell structure having cavities connected by channels for micro-fabricated atomic clocks, magnetometers, and other devices.

BACKGROUND

Various types of devices operate using radioactive gas or other gas within a gas cell. For example, micro-fabricated atomic clocks (MFACs) and micro-fabricated atomic magnetometers (MFAMs) often include a cavity containing a metal vapor and a buffer gas. In some devices, the metal vapor and the buffer gas are created by dissociating cesium azide ($CsN_3$) into cesium vapor and nitrogen gas ($N_2$).

SUMMARY

This disclosure provides a vapor cell structure having cavities connected by channels for micro-fabricated atomic clocks, magnetometers, and other devices.

In a first example, an apparatus includes a vapor cell having first and second cavities fluidly connected by multiple channels. The first cavity is configured to receive a material able to dissociate into one or more gases that are contained within the vapor cell. The second cavity is configured to receive the one or more gases. The vapor cell is configured to allow radiation to pass through the second cavity.

In a second example, a system includes a vapor cell and an illumination source. The vapor cell includes first and second cavities fluidly connected by multiple channels. The first cavity is configured to receive a material able to dissociate into one or more gases that are contained within the vapor cell. The second cavity is configured to receive the one or more gases. The illumination source is configured to direct radiation through the second cavity.

In a third example, an apparatus includes a vapor cell having a first wafer with first and second cavities and a second wafer with one or more channels fluidly connecting the cavities. The first cavity is configured to receive a material able to dissociate into one or more gases that are contained within the vapor cell. The second cavity is configured to receive the one or more gases. The vapor cell is configured to allow radiation to pass through the second cavity.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 9, discussed below, and the various examples used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

FIGS. 1 through 4 illustrate an example vapor cell structure 100 in accordance with this disclosure. The vapor cell structure 100 can be used, for example, to receive an alkali-based material (such as cesium azide) and to allow dissociation of the alkali-based material into a metal vapor and a buffer gas (such as cesium vapor and nitrogen gas). However, this represents one example use of the vapor cell structure 100. The vapor cell structure 100 described here could be used in any other suitable manner.

Figure 1:
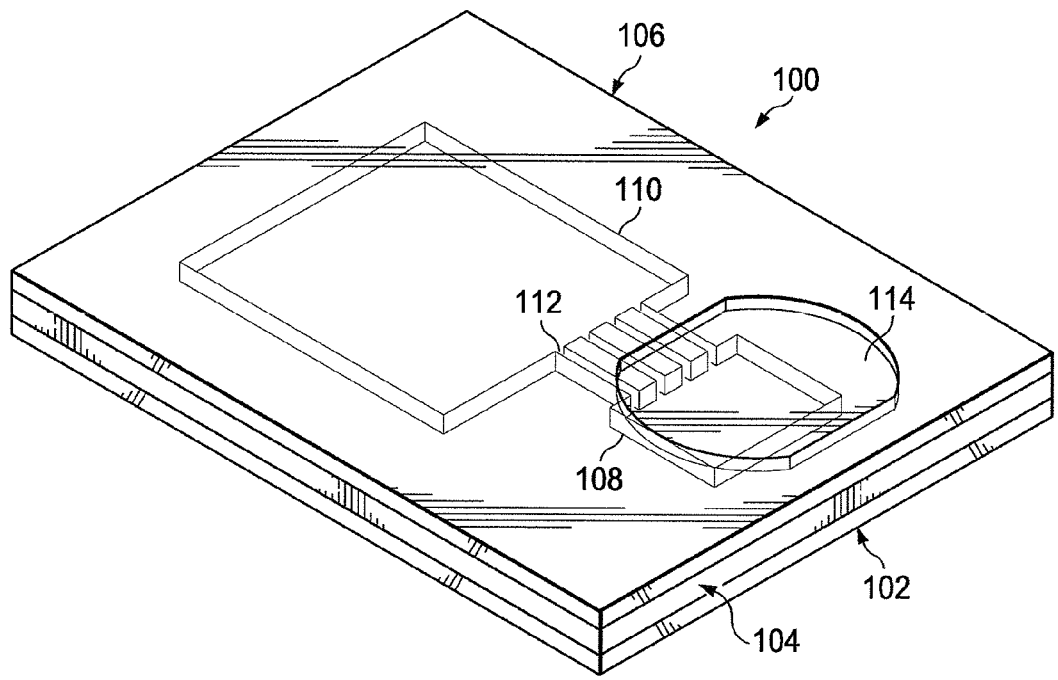
FIGS. 1 through 4 illustrate an example vapor cell structure in accordance with this disclosure.
Figure 2:
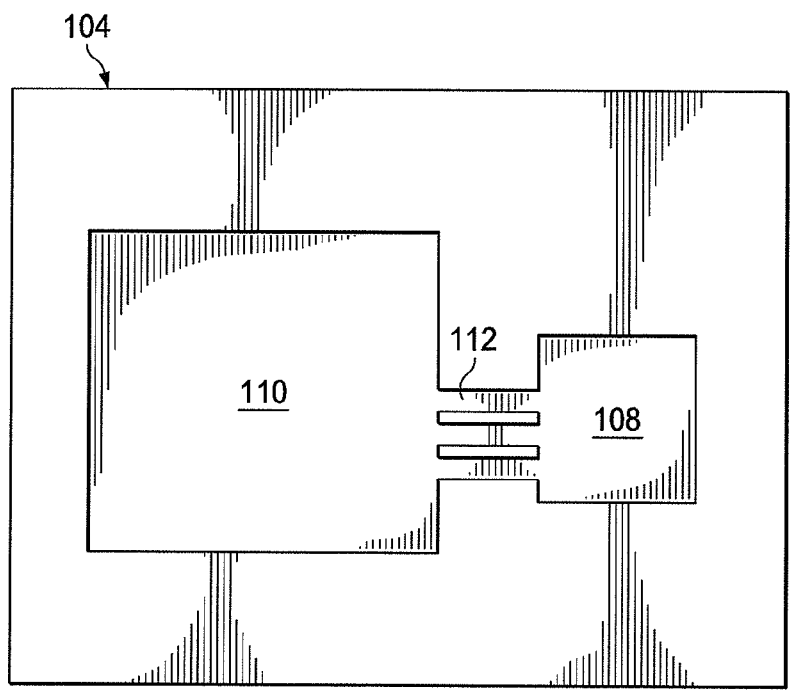
Figure 3:
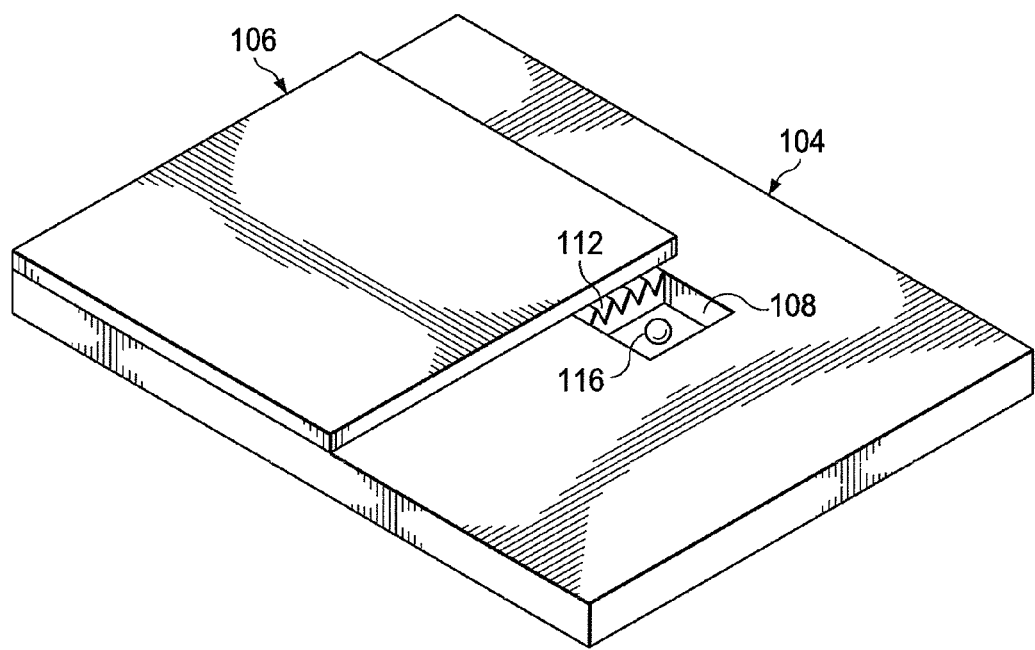

As shown in FIGS. 1 through 3, the vapor cell structure 100 includes a bottom wafer 102, a middle wafer 104, and a top wafer 106. The bottom wafer 102 generally represents a structure on which other components of the vapor cell structure 100 can be placed. The bottom wafer 102 is also substantially optically transparent to radiation passing through the vapor cell structure 100 during operation of a device, such as a micro-fabricated atomic clock, magnetometer, or other device. The bottom wafer 102 can be formed from any suitable material(s) and in any suitable manner. The bottom wafer 102 could, for instance, be formed from borosilicate glass, such as PYREX or BOROFLOAT glass.

The middle wafer 104 is secured to the bottom wafer 102, such as through bonding. The middle wafer 104 includes multiple cavities 108-110 through the middle wafer 104. Each cavity 108-110 could serve a different purpose in the vapor cell structure 100. For example, the cavity 108 can receive a material to be dissociated, such as cesium azide ($CsN_3$) or other alkali-based material. The cavity 108 can be referred to as a "reservoir cavity." The cavity 110 can receive gas from the cavity 108, such as a metal vapor and a buffer gas. Laser illumination or other illumination could pass through the cavity 110 during operation of a device, such as a micro-fabricated atomic clock, magnetometer, or other device. The cavity 110 can be referred to as an "interrogation cavity."

Multiple channels 112 fluidly connect the cavities 108-110 in the vapor cell structure 100. Each channel 112 represents any suitable passageway through which gas or other material(s) can flow. In this example, there are three channels 112, although the vapor cell structure 100 could include two or more than three channels 112. Also, the channels 112 here are generally straight, have equal lengths, and are parallel to one another. However, the channels 112 could have any other suitable form(s).

The middle wafer 104 could be formed from any suitable material(s) and in any suitable manner. For example, the middle wafer 104 could represent a silicon wafer, and the cavities 108-110 and the channels 112 could be formed in the silicon wafer using one or more wet etches or other suitable processing techniques. As a particular example, the channels 112 could be formed in a silicon wafer using a potassium hydroxide (KOH) wet etch. The etch of the silicon wafer could also be performed in a self-limiting manner, meaning the etch stops itself at or around a desired depth. For instance, when a narrow mask opening is used to expose the silicon wafer and the etching occurs at a suitable angle (such as about 54.74°), the etching can self-terminate before it etches completely through the silicon wafer.

Each cavity 108-110 and channel 112 could have any suitable size, shape, and dimensions. Also, the relative sizes of the cavities 108-110 and channels 112 shown in FIGS. 1 through 3 are for illustration only, and each cavity 108-110 or channel 112 could have a different size relative to the other cavities or channels. Further, the relative depth of each channel 112 compared to the depth(s) of the cavities 108-110 is for illustration only, and each cavity 108-110 and channel 112 could have any other suitable depth. In addition, while each cavity 108-110 is shown as being formed completely through the wafer 104, each cavity 108-110 could be formed partially through the wafer 104.

The top wafer 106 is secured to the middle wafer 104, such as through bonding. The top wafer 106 generally represents a structure that caps the cavities 108-110 and channels 112 of the middle wafer 104, thereby helping to seal material (such as gas) into the vapor cell structure 100. The top wafer 106 is also substantially optically transparent to radiation passing through the vapor cell structure 100 during operation of a device, such as a micro-fabricated atomic clock, magnetometer, or other device. The top wafer 106 can be formed from any suitable material(s) and in any suitable manner. The top wafer 106 could, for instance, be formed from borosilicate glass, such as PYREX or BOROFLOAT glass.

As shown here, a portion 114 of the top wafer 106 could be thinner than the remainder of the top wafer 106. This may help to facilitate easier UV irradiation of material placed inside the reservoir cavity 108. Note that any wafer 102-106 in the vapor cell structure 100 could have a non-uniform thickness at any desired area(s) of the wafer(s). Also note that the portion 114 of the top wafer 106 could have any suitable size, shape, and dimensions and could be larger or smaller than the reservoir cavity 108. The portion 114 of the top wafer 106 could be thinned in any suitable manner, such as with a wet isotropic etch.

Figure 4:
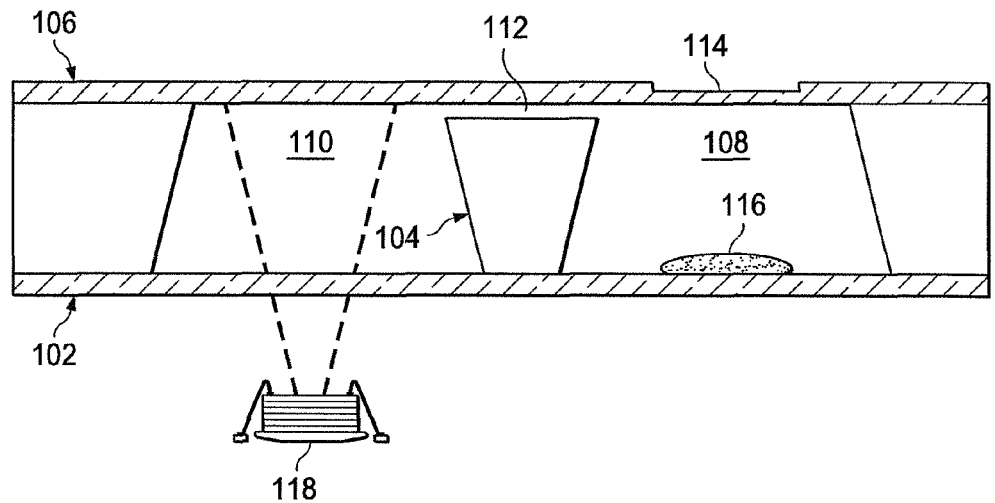

During fabrication of the vapor cell structure 100, the bottom and middle wafers 102-104 could be secured together, and the middle wafer 104 can be etched to form the cavities 108-110 and the channels 112 (either before or after the bottom and middle wafers 102-104 are secured together). An alkali-based material 116 (such as cesium azide) or other material(s) can be deposited into the reservoir cavity 108 as shown in FIGS. 3 and 4. Any suitable deposition technique can be used to deposit the material(s) 116 into the cavity 108. The top wafer 106 can be secured to the middle wafer 104 once the material 116 is placed in the cavity 108. At this point, the cavities 108-110 and the channels 112 can be sealed.

At least a portion of the material 116 in the cavity 108 can be dissociated. This could be accomplished by exposing the material 116 in the cavity 108 to ultraviolet (UV) radiation. For example, an alkali-based material 116 can be dissociated into a metal vapor and a buffer gas. As a particular example, cesium azide could be dissociated into cesium vapor and nitrogen gas ($N_2$). Note, however, that other mechanisms could be used to initiate the dissociation, such as thermal dissociation. The dissociation of the material 116 creates gas inside the reservoir cavity 108, which can flow into the interrogation cavity 110 through the channels 112.

In conventional devices, material is often dissociated in a single cavity, and the resulting gas is kept in the same cavity. Radiation can be passed through the gas in that single cavity during operation of a device, but residue from the original material may still exist in that single cavity. This residue can interfere with the optical properties of the cavity and lead to device failure.

In accordance with this disclosure, the material 116 can be placed in one cavity 108 and dissociated, and the resulting gas can be used in a different cavity 110 during device operation. As shown in FIG. 4, an illumination source 118, such as a vertical-cavity surface-emitted laser ("VCSEL") or other laser, could direct radiation through the interrogation cavity 110. Even if residue exists in the reservoir cavity 108, it may not interfere with the optical properties in the cavity 110.

The use of multiple channels 112 also helps to ensure that vapor can travel from the reservoir cavity 108 into the interrogation cavity 110, even if one or more channels 112 become blocked by debris or other material(s). In particular embodiments, the channels 112 could represent self-height-eliminating channels fabricated using a wet etch, rather than a more expensive and time-consuming dry etch. This can help to simplify the manufacture of the vapor cavity structure 100. In addition, thinning the portion 114 of the top wafer 106 through which UV radiation is directed into the reservoir cavity 108 allows for enhanced dissociation of the material 116 in the cavity 108 (possibly at reduced power levels) while maintaining the mechanical integrity of the overall device.

Although FIGS. 1 through 4 illustrate one example of a vapor cell structure 100, various changes may be made to FIGS. 1 through 4. For example, the vapor cell structure 100 need not include two cavities and could include three or more cavities. Also, the cavities 108-110 and channels 112 need not be arranged linearly, and the channels 112 need not be straight. Any arrangement of cavities connected by channels could be used, including non-linear and multi-level arrangements. Further, the vapor cell structure 100 could be used with any other material(s) and is not limited to alkali-based materials or metal vapors and buffer gases. In addition, the vapor cell structure 100 can be used in any other suitable manner and is not limited to the use shown in FIG. 4.

Figure 5:
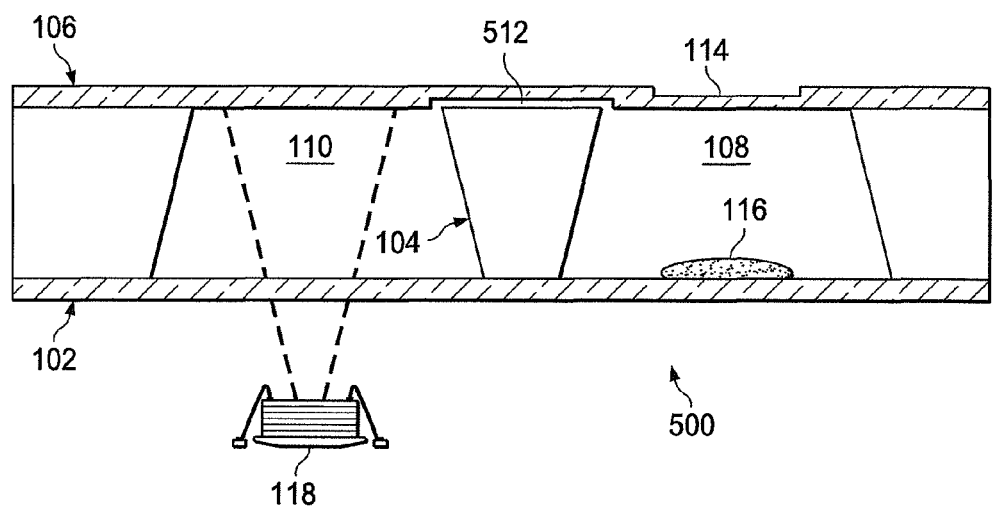
FIGS. 5 and 6 illustrate another example vapor cell structure in accordance with this disclosure.
Figure 6:
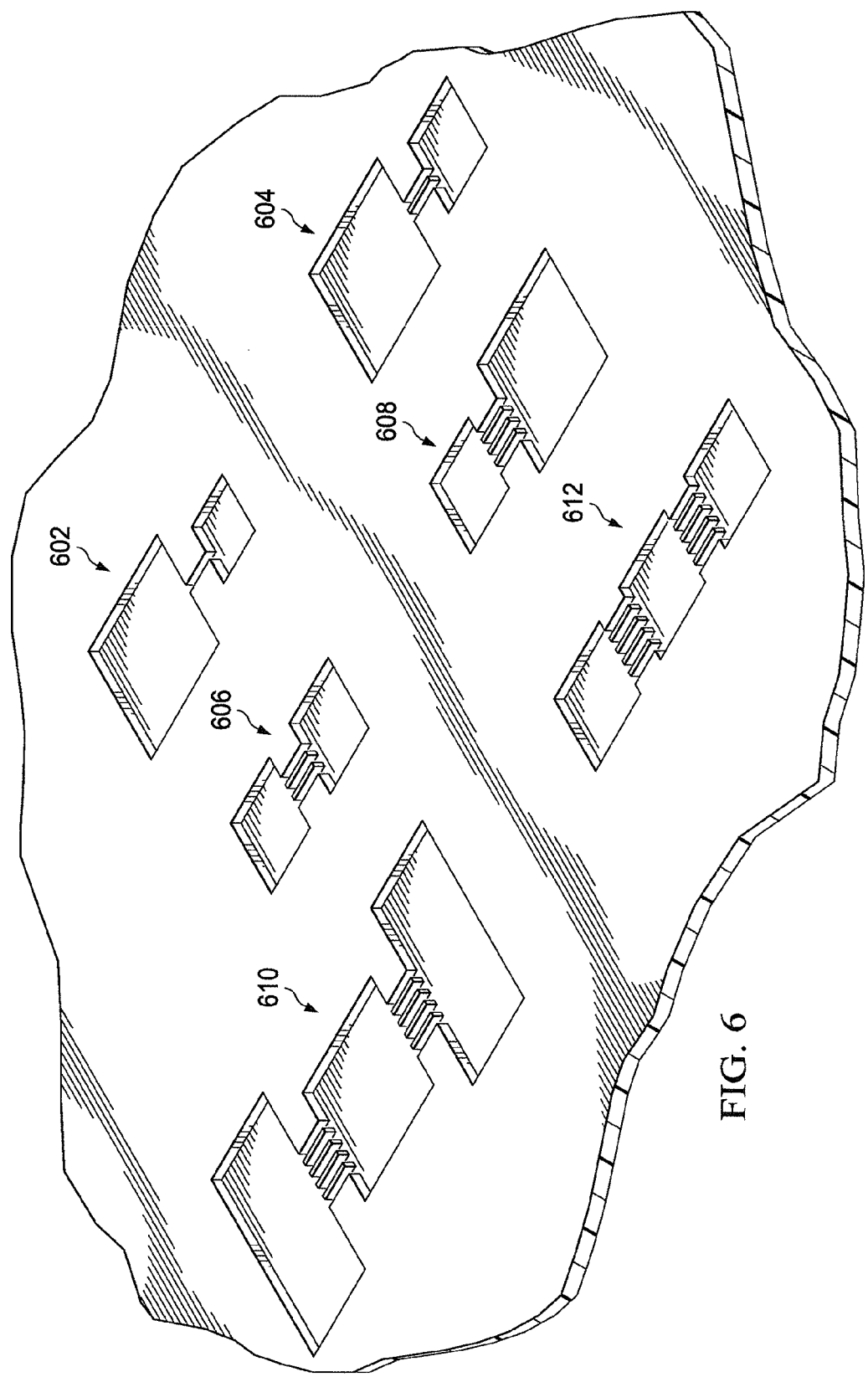

FIGS. 5 and 6 illustrate another example vapor cell structure 500 in accordance with this disclosure. The vapor cell structure 500 shown here is similar in structure to that shown in FIGS. 1 through 4. Reference numerals 102-110 and 114-118 are used here to denote structures that may be the same as or similar to structures described above. In this example, however, channels are not formed in the middle wafer 104. Rather, one or more channels 512 are formed in the top wafer 106. The top wafer 106 in this example may be said to represent a "capping" layer since it can be secured to the middle wafer 104 after the material 116 is inserted into the cavity 108, thereby capping the structure 500.

The channels 512 (and possibly portions of the cavities 108-110) can be etched into the top wafer 106 in any suitable manner. For example, a photoresist mask can be formed on the top wafer 106, patterned, and baked/cured. An isotropic wet etch, such as one using a hydrofluoric acid (HF) dip, can then be performed to etch exposed portions of the top wafer 106. The composition of the wet etch bath and the etch time can be selected to reduce the thickness of the top wafer 106 as desired. The photoresist layer can then be removed, and the top wafer 106 can be cleaned in preparation for securing to the middle wafer 104. In this way, the top wafer 106 need not be thinned significantly or at all over the interrogation cavity 110, helping to preserve the mechanical strength of the vapor cell structure 500. The channels 512 in the capping layer can also serve other functions, such as by serving as condensation sites in the vapor cell structure 500.

FIG. 6 illustrates various examples of the channels and cavity portions that can be etched into a capping layer, such as the top wafer 106. For example, arrangement 602 includes portions of two unequally-sized cavities and a single channel between the cavities. Arrangement 604 includes portions of two unequally-sized cavities and two channels between the cavities. Arrangement 606 includes portions of two equally-sized cavities and three channels between the cavities. Arrangement 608 includes portions of two unequally-sized cavities and four channels between the cavities. Arrangement 610 includes portions of three unequally-sized cavities and five channels coupling each adjacent pair of cavities. Arrangement 612 includes portions of three equally-sized cavities and five channels coupling each adjacent pair of cavities. These arrangements are for illustration only, and other arrangements of cavities and channels (whether linear or non-linear) could be used in the vapor cell structure 500.

In particular embodiments, the top wafer 106 could be formed from borosilicate glass, and the etch of the top wafer 106 could occur using a hydrofluoric acid (BHF) bath. A hard mask could be used to mask the top wafer 106. Any suitable etch, hard mask, and etch depth could also be used.

Although FIGS. 5 and 6 illustrate another example of a vapor cell structure 500, various changes may be made to FIGS. 5 and 6. For example, the vapor cell structure 500 could include any number of cavities and any number of channels in any suitable arrangement. Also, the vapor cell structure 500 could be used with any suitable material(s) and is not limited to alkali-based materials or metal vapors and buffer gases. In addition, the vapor cell structure 500 can be used in any other suitable manner.

Figure 7:
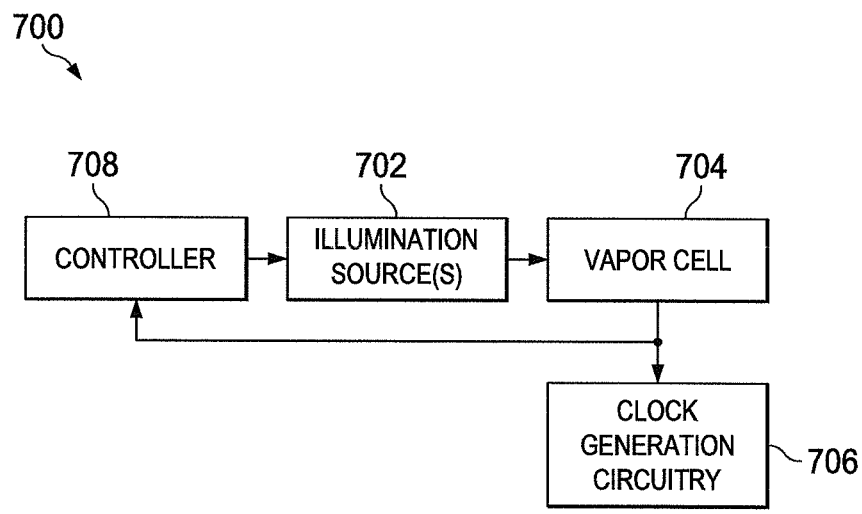
FIGS. 7 and 8 illustrate example devices containing at least one vapor cell structure in accordance with this disclosure.
Figure 8:
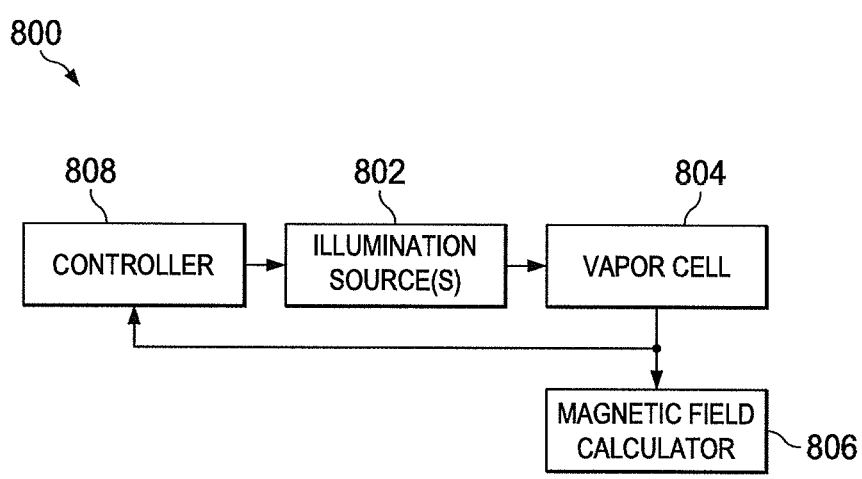

FIGS. 7 and 8 illustrate example devices containing at least one vapor cell structure in accordance with this disclosure. As shown in FIG. 7, a device 700 represents a micro-fabricated atomic clock or other atomic clock. The device 700 here includes one or more illumination sources 702 and a vapor cell 704. Each illumination source 702 includes any suitable structure for generating radiation, which is directed through the vapor cell 704. Each illumination source 702 could, for example, include a laser or lamp.

The vapor cell 704 represents a vapor cell structure, such as the vapor cell structure 100 or 500 described above. The radiation from the illumination source(s) 702 passes through the interrogation cavity 110 of the vapor cell 704 and interacts with the metal vapor. The radiation can also interact with one or more photodetectors that measure the radiation passing through the interrogation cavity 110. For example, photodetectors can measure radiation from one or more lasers or lamps.

Signals from the photodetectors are provided to clock generation circuitry 706, which uses the signals to generate a clock signal. When the metal vapor is, for example, rubidium 87 or cesium 133, the signal generated by the clock generation circuitry 706 could represent a highly-accurate clock. The signals from the photodetectors are also provided to a controller 708, which controls operation of the illumination source(s) 702. The controller 708 helps to ensure closed-loop stabilization of the atomic clock.

As shown in FIG. 8, a device 800 represents a micro-fabricated atomic magnetometer or other atomic magnetometer. The device 800 here includes one or more illumination sources 802 and a vapor cell 804. Each illumination source 802 includes any suitable structure for generating radiation, which is directed through the vapor cell 804. Each illumination source 802 could, for example, include a laser or lamp.

The vapor cell 804 represents a vapor cell structure, such as the vapor cell structure 100 or 500 described above. The radiation from the illumination source(s) 802 can pass through the interrogation cavity 110 of the vapor cell 804 and interact with the metal vapor. The radiation can also interact with one or more photodetectors that measure the radiation passing through the interrogation cavity 110. For example, photodetector(s) can measure radiation from one or more lasers or lamps.

Signals from the photodetector(s) are provided to a magnetic field calculator 806, which uses the signals to measure a magnetic field passing through the interrogation cavity 110. The magnetic field calculator 806 here is capable of measuring extremely small magnetic fields. The signals from the photodetector(s) can also be provided to a controller 808, which controls operation of the illumination source(s) 802.

Although FIGS. 7 and 8 illustrate examples of devices 700 and 800 containing at least one vapor cell structure, various changes may be made to FIGS. 7 and 8. For example, the devices 700 and 800 shown in FIGS. 7 and 8 have been simplified in order to illustrate example uses of the vapor cell structures 100 and 500 described above. Atomic clocks and atomic magnetometers can have various other designs of varying complexity with one or multiple vapor cell structures.

Figure 9:
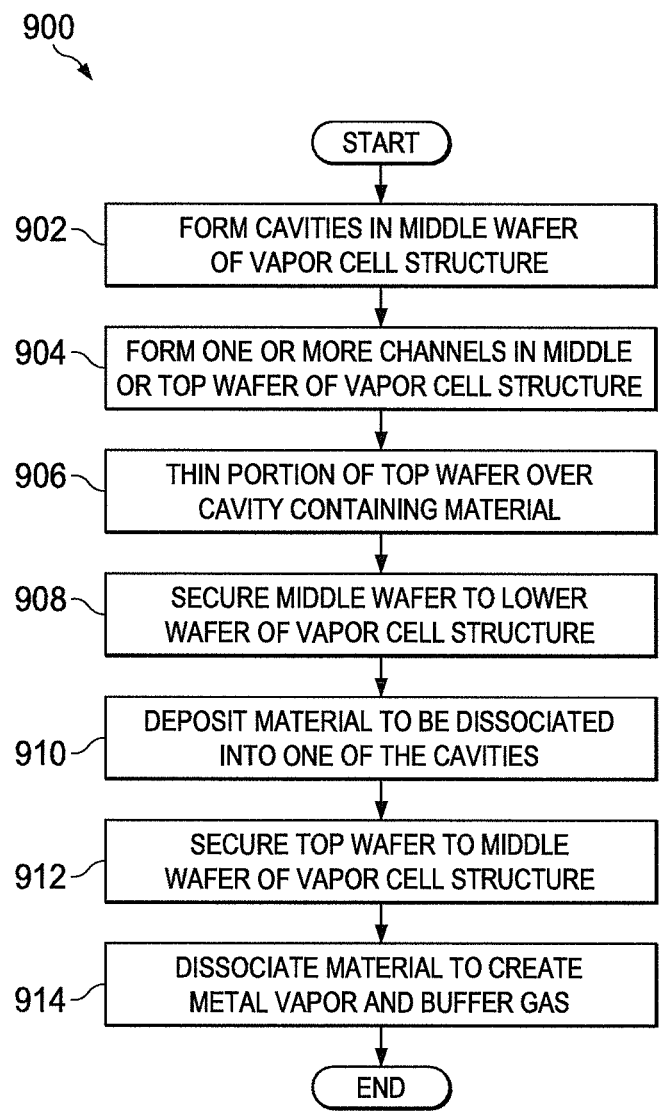
FIG. 9 illustrates an example method for forming a vapor cell structure in accordance with this disclosure.

FIG. 9 illustrates an example method 900 for forming a vapor cell structure in accordance with this disclosure. As shown in FIG. 9, multiple cavities are formed in a middle wafer of a vapor cell structure at step 902. This could include, for example, forming cavities 108-110 in a silicon wafer or other middle wafer 104. Any suitable technique could be used to form the cavities, such as a wet or dry etch.

One or more channels are formed in the middle wafer or a top wafer of the vapor cell structure at step 904. This could include, for example, forming one or more channels 112 in the silicon wafer or other middle wafer 104. This could also include forming one or more channels 512 in the top wafer 106 or other capping layer. Any suitable technique could be used to form the channels, such as a wet etch. The formation of the cavities and channels could also overlap, such as when the same etch is used to form both the cavities 108-110 and the channels 112.

A portion of the top wafer is thinned at step 906. This could include, for example, etching a portion 114 of the top wafer 106 in an area adjacent to the reservoir cavity 108. Any suitable etch can occur here, such as an isotropic wet etch. The formation of channels in the top wafer and the thinning of the top wafer could also overlap, such as when the same etch is used to form both the channels 512 and the thinned portion 114.

The middle wafer is secured to a lower wafer at step 908. This could include, for example, bonding the middle wafer 104 to the bottom wafer 102. If the cavities 108-110 are formed completely through the middle wafer 104, securing the middle wafer 104 to the bottom wafer 102 can seal the lower openings of the cavities 108-110.

A material to be dissociated is deposited in at least one of the cavities at step 910. This could include, for example, depositing the material 116 into the reservoir cavity 108.

Any suitable deposition technique could be used to deposit any suitable material(s) 116, such as an alkali-based material.

The top wafer is secured to the middle wafer at step 912. This could include, for example, bonding the top wafer 106 to the middle wafer 104. Securing the top wafer 106 to the middle wafer 104 can seal the upper openings of the cavities 108-110 and the channels 112, 512. At this point, the cavities and channels in the vapor cell structure can be sealed against the outside environment.

The material is dissociated to create metal vapor and buffer gas at step 914. This could include, for example, applying UV radiation to the material 116 through the thinned portion 114 of the top wafer 106. This could also include converting at least a portion of the material 116 into the metal vapor and buffer gas. Note, however, that other dissociation techniques could also be used.

In this way, the vapor cell structure can be fabricated in a manner that allows easier dissociation of the material 116 while maintaining the structural integrity of the vapor cell. Moreover, the use of multiple channels can help to ensure that gas can flow into the interrogation cavity 110, even when one or more channels are blocked.

Although FIG. 9 illustrates one example of a method 900 for forming a vapor cell structure, various changes may be made to FIG. 9. For example, as noted above, various modifications can be made to the fabrication process. Also, while shown as a series of steps, various steps in FIG. 9 could overlap, occur in parallel, or occur in a different order.

It may be advantageous to set forth definitions of certain words and phrases used throughout this patent document. The terms "top," "middle," and "bottom" refer to structures in relative positions in the figures and do not impart structural limitations on how a device is manufactured or used. The term "secured" and its derivatives mean to be attached, either directly or indirectly via another structure. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising: a vapor cell having first and second cavities fluidly connected by multiple channels; the first cavity configured to receive a material to dissociate into one or more gases that are contained within the vapor cell; the second cavity configured to receive the one or more gases; wherein the vapor cell is configured to allow radiation to pass through the second cavity; a silicon wafer comprising the cavities and the channels; and an optically transparent wafer secured to the silicon wafer, wherein the optically transparent wafer is thinner vertically between the silicon wafer and the optically transparent wafer in a location proximate to the first cavity than at a location proximate the second cavity and wherein the first and second cavities do not extend into the optically transparent wafer.

2. The apparatus of claim 1, wherein the material comprises an alkali-based material to dissociate into a metal vapor and a buffer gas.

3. The apparatus of claim 2, wherein the material comprises cesium azide (CsN3) and dissociates into cesium vapor and nitrogen gas (N2).

4. A system comprising: a vapor cell comprising first and second cavities fluidly connected by multiple channels; the first cavity configured to receive a material to dissociate into one or more gases that are contained within the vapor cell; and the second cavity configured to receive the one or more gases; an illumination source configured to direct radiation through the second cavity; a first wafer comprising the cavities and the channels; and a second wafer having a top surface and a bottom surface where the bottom surface is secured to the first wafer, the second wafer sealing ends of the cavities and the channels wherein the first and second cavities do not extend into the second wafer, wherein the second wafer has a recess in the top surface is in a location proximate to the first cavity and no recess in the top surface in a location proximate the second cavity, wherein the recess extends only partially through the second wafer.

5. The system of claim 4, further comprising:
    clock generation circuitry configured to generate a clock signal based on the radiation directed through the second cavity.

6. The system of claim 4, wherein the material comprises an alkali-based material able to dissociate into a metal vapor and a buffer gas.

7. The system of claim 6, wherein the material comprises cesium azide ($CsN_3$) and is able to dissociate into cesium vapor and nitrogen gas ($N_2$).

8. An apparatus, comprising: a first and a second optically transparent wafer; and a silicon wafer between the first and second optically transparent wafers, wherein the silicon wafer includes a first cavity and a second cavity fluidly connected to each other via multiple channels to form a vapor cell; the first cavity and the second cavity extend from the first optically transparent wafer to the second optically transparent wafer; the multiple channels extend laterally from the first cavity to the second cavity and vertically between the silicon wafer and the first optically transparent wafer; the first optically transparent wafer is thinner in a location over the first cavity than at any location over the second cavity; and the first cavity is smaller than the second cavity.

9. The system of claim 8, wherein the material comprises cesium azide ($CsN_3$).

10. The system of claim 8, further comprising clock generation circuitry.

11. The system of claim 8, further comprising a magnetic field calculator.

* * * * *